United States Patent [19]

Kinoshita et al.

[11] Patent Number: 4,982,696

[45] Date of Patent: Jan. 8, 1991

[54] APPARATUS FOR FORMING THIN FILM

[75] Inventors: Mikio Kinoshita, Kawasaki; Wasaburo Ohta, Yokohama; Masashi Nakazawa, Yokohama, all of Japan

[73] Assignee: Ricoh Company, Ltd., Tokyo, Japan

[21] Appl. No.: 294,377

[22] Filed: Jan. 6, 1989

[30] Foreign Application Priority Data

| Jan. 8, 1988 | [JP] | Japan | 63-2089 |
| Jan. 8, 1988 | [JP] | Japan | 63-2090 |
| Jan. 8, 1988 | [JP] | Japan | 63-2091 |
| Jan. 11, 1988 | [JP] | Japan | 63-3595 |
| Jan. 11, 1988 | [JP] | Japan | 63-3596 |
| Jan. 11, 1988 | [JP] | Japan | 63-3597 |
| Feb. 4, 1988 | [JP] | Japan | 63-24829 |
| Mar. 23, 1988 | [JP] | Japan | 63-68732 |
| Dec. 15, 1988 | [JP] | Japan | 63-316942 |

[51] Int. Cl.$^5$ .................................. C23C 16/50
[52] U.S. Cl. ................... 118/723; 118/726; 118/728; 204/192.31; 204/298; 427/38; 427/255.2
[58] Field of Search ............... 118/723, 725, 726, 728; 204/192.31, 298 PI; 427/38, 255.2, 39

[56] References Cited

U.S. PATENT DOCUMENTS

| 3,583,361 | 6/1971 | Laudel, Jr. | 118/723 |
| 4,805,555 | 2/1989 | Itoh | 118/723 |

FOREIGN PATENT DOCUMENTS

| 59-157279 | 9/1984 | Japan | 204/298 |
| 60-183721 | 9/1985 | Japan | 118/726 |
| 60-215759 | 10/1985 | Japan | 118/726 |
| 61-73877 | 4/1986 | Japan | 118/723 |
| 62-26809 | 2/1987 | Japan | 118/726 |
| 62-122209 | 6/1987 | Japan | 118/726 |
| 62-122210 | 6/1987 | Japan | 118/723 |
| 63-93870 | 4/1988 | Japan | 118/728 |

Primary Examiner—Shrive P. Beck
Assistant Examiner—Terry J. Owens
Attorney, Agent, or Firm—Cooper & Dunham

[57] ABSTRACT

An apparatus for forming thin film includes a vacuum container to which an active gas, an inert gas, or a mixture thereof is introduced, a source of evaporation for evaporating a substance being evaporated in the vacuum container, a counter electrode disposed in the vacuum container and holding a substrate for forming a thin film thereon in such a manner as to be opposed to the source of evaporation, a grid disposed between the source of evaporation and the counter electrode and having openings which allow the substance being evaporated to pass therethrough, a filament for thermionic emission disposed between the grid and the source of evaporation and a power source device for establishing a predetermined electric potential relationship between the grid, the counter electrode, and the filament.

13 Claims, 10 Drawing Sheets

APPARATUS FOR FORMING THIN FILM

BACKGROUND OF THE INVENTION

The present invention relates to an apparatus and a method for forming a thin film which are suitable for forming a metal thin film or a semiconductor thin film which constitutes an IC, LSI or the like.

Various means for forming a thin film on a substrate have conventionally been proposed and various methods have been adopted therefor. An ion plating method, CVD and PVD, for example, are typical of those methods.

The ion plating method is a method of ionizing and depositing in vacuum the substance which is evaporated in an active gas or an inert gas by producing a high-frequency electromagnetic field between a source of evaporation and a substance being evaporated. The ion plating method includes DC ion plating in which a DC voltage is applied between the source of evaporation and the substance being evaporated. These ion plating methods are disclosed in, for example, Japanese Patent Publication No. 52-29971 (1977).

Commonly owned Japanese Patent Application Laid-Open (KOKAI) No. 59-89763 (1984) discloses an apparatus for depositing a thin film. This apparatus is provided with a counter electrode or a substrate holder for holding a substrate for deposition, and a grid disposed between the counter electrode and a source of evaporation which opposes the counter electrode or the substrate holder in such a manner as to be impressed with a positive potential relative to the counter electrode or the substrate holder. A filament for thermionic emission is further disposed between the grid and the source of evaporation. The grid is impressed with a positive potential relative to the filament to form a thin film. According to this structure, the substance evaporated from the source of evaporation is ionized by the thermions emitted from the filament. The ionized substance which passes through the grid is accelerated by the action of an electric field which is directed from the grid to the counter electrode or the substrate holder and impinges on the substrate, thereby forming a thin film having a good adhesion on the substrate.

There are many other methods and apparatuses for forming a thin film.

The conventional methods of forming a thin film, however, have some problems. A first problem is that the adhesion between the thin film formed and the substrate is weak, and a second problem is that it is difficult to form a thin film on a substrate having a low heat resistance.

Especially, in the case of the method disclosed in Japanese Patent Application Laid-Open (KOKAI) No. 59-89763 (1984), a third problem is produced that when a high-melting substance is used, it is necessary to use an electron gun at the source of evaporation, which leads to a complicated structure of the apparatus and raised cost.

A fourth problem is that when an electron gun is used, the electrons spring out from the electron gun into the adjacent space, and even when the source of evaporation which consists of a substance being evaporated is used, if one terminal of the power source for heating the source of evaporation has a ground potential, the thermions spring out together with the evaporating substance, thereby influencing the plasma state so as to make the control thereof difficult.

Nonuniformity of a film thickness is a fifth problem. For example, in the case of forming a thin film by vacuum deposition, since the density of the particles flown from the source of evaporation to the substrate is not uniform, the distribution in the plane of the thin film formed is generally not uniform. Therefore, this method is unsuitable for the formation of a thin film which is required to have a uniformity in the film thickness, e.g., an optical thin film.

In order to ameliorate the nonuniformity of the film thickness, various methods have conventionally been proposed.

For example, there is a method of providing a plurality of sources of evaporation in order to improve the uniformity of the thickness distribution of a thin film formed on a substrate which is difficult in the case of using a single source of evaporation. Even the use of the plurality of sources of evaporation, however, cannot completely eliminate the nonuniformity of the thickness distribution. In addition, this method requires a comparatively high cost and, especially, in the case of using an electron beam EB as the source of evaporation, the cost of the apparatus is disadvantageously much raised.

There is also a method of disposing a plurality of substrates in such a manner as to have a curved surface at which the thickness of the thin film formed is equal, namely, an equal-thickness surface. Since such an equal-thickness surface is a curved surface, the method of disposing a plurality of substrates on the equal-thickness surface is effective when the size of the substrate is so small relative to the distance between the source of evaporation and the substrate that the equal-thickness surface is regarded as approximately a flat surface in the order of the size of the substrate. On the other hand, when the size of the substrate is large and the substrate is not in conformity with the equal-thickness surface (curved surface), this method is not effective.

In addition, there is a method of disposing a planetary jig for revolving the substrate opposed to the source of evaporation around one point in the vacuum container and rotating the substrate on its own axis while using another point in the vacuum container as the center thereof. This method requires a space in the vacuum container which allows the revolution of the substrate around one point and on its own axis, thereby disadvantageously increasing the size of the apparatus. Especially, in the case of using a substrate having a general curved surface or a large flat surface which does not allow for sufficient revolution of the substrate around one point and on its own axis in the vacuum container, it is difficult to make a thin film having a uniform thickness.

As a method of forming a zinc-oxide-base transparent conductive film such as a zinc oxide film and an aluminized zinc oxide film there are known ion plating, reactive sputtering, etc. The ion plating method is a method of ionizing and depositing in vacuum the substance which is evaporated in an active gas or an inert gas by producing a high-frequency electromagnetic field between a source of evaporation and a substance being evaporated, as disclosed in, for example, Japanese Patent Publication No. 52-29971 (1977). The reactive sputtering is known as reactive magnetron sputtering, as shown in, for example, "Nitto Giho" Vol. 24 No. 1, April (1986).

A sixth problem is that it is difficult to form a transparent conductive film by these methods while so controlling the high electric conductivity and the optical transmittance, which are the main film properties, as to have given values.

SUMMARY OF THE INVENTION

Accordingly, it is a first object of the present invention to provide an apparatus for forming a thin film which is capable of forming a dense thin film having a very strong adhesion on a substrate and which is capable of using a material having a low heat resistance such as a plastic sheet for the substrate.

It is a second object of the present invention to provide an apparatus for forming a thin film which is capable of forming a thin film having a very strong adhesion on a substrate and which is capable of forming a thin film of even a high-melting material or a compound thereof at a low cost.

It is a third object of the present invention to provide a method of forming a transparent conductive film on a substrate while controlling the electric conductivity and the optical transmittance thereof by the mixing ratio of an introducing gas, the pressure thereof, the voltage applied to a grid, the film-forming rate and the like.

According to the present invention, the first object can be obtained by a first apparatus of the present invention, that is, an apparatus for forming a thin film comprising:

a vacuum container to which an active gas, an inert gas or a mixture thereof is introduced;

a source of evaporation for evaporating a substance being evaporated in said vacuum container;

a counter electrode disposed in said vacuum container and holding a substrate for forming a thin film thereon in such a manner as to be opposed to said source of evaporation;

a grid disposed between said source of evaporation and said counter electrode and having openings which allow said substance being evaporated to pass therethrough;

a filament for thermionic emission disposed between said grid and said source of evaporation; and a power source means for establishing a predetermined electric potential relationship between said grid, said counter electrode and said filament in which the potentials of said counter electrode and said filament are negative relative to the potential of said grid.

According to the first apparatus of the present invention, since the ionization of the substance evaporated from the source of evaporation is carried out in a very high state by the thermions from the filament, it is possible to form a thin film excellent in adhesion, evenness of the surface and crystallinity on the substrate. At this time, since high energy is produced by the high ionization, it is possible to form a film at a low temperature without being provided with heat energy, so that a substrate which is inferior in heat resistance such as a plastic sheet, etc. is usable.

The first object can be also obtained by a second apparatus of the present invention, that is, an apparatus for forming a thin film comprising:

a vacuum container to which an active gas, an inert gas or a mixture thereof is introduced;

a source of evaporation for evaporating a substance being evaporated in said vacuum container;

a counter electrode disposed in said vacuum container and holding a substrate for forming a thin film thereon in such a manner as to be opposed to said source of evaporation;

a grid disposed between said source of evaporation and said counter electrode and having openings which allow said substance being evaporated to pass therethrough;

a filament for thermionic emission disposed between said grid and said source of evaporation; and a power source means for establishing a predetermined electric potential relationship between said grid, said counter electrode and said filament in which the potential of said counter electrode is negative relative to the potential of said grid and positive relative to the potential of said filament.

According to the second apparatus of the present invention, since the ionization of the substance evaporated from the source of evaporation is carried out in a very high state by the thermions from the filament, and since the surface of a substrate is activated by the thermions because the electric potential of the counter electrode is higher than that of the filament, it is possible to form a thin film excellent in adhesion, evenness of the surface and crystallinity on the substrate. At this time, since high energy is produced by the high ionization, it is possible to form a film at a low temperature without being provided with heat energy, so that a substrate which is inferior in heat resistance such as a plastic sheet, etc. is usable.

The first object can be also obtained by a third apparatus of the present invention, that is, an apparatus for forming a thin film comprising:

a vacuum container to which an active gas, an inert gas or a mixture thereof is introduced;

a source of evaporation for evaporating a substance being evaporated in said vacuum container;

a substrate holder disposed in said vacuum container for holding a substrate for forming a thin film thereon in such a manner as to be opposed to said source of evaporation and being electrically insulated from other elements;

a grid disposed between said source of evaporation and said substrate holder and having openings which allow said substance being evaporated to pass therethrough;

a filament for thermionic emission disposed between said grid and said source of evaporation; and a power source means for establishing a predetermined electric potential relationship between said grid and said filament in which the potential of said grid is positive relative to the potential of said filament.

According to the third apparatus of the present invention, since the ionization of the substance evaporated from the source of evaporation is carried out in a very high state by the thermions from the filament, it is possible to form a thin film excellent in adhesion, evenness of the surface and crystallinity on the substrate. At this time, since high energy is produced by the high ionization, it is possible to form a film at a low temperature without being provided with heat energy, so that a substrate which is inferior in heat resistance such as a plastic sheet, etc. is usable. In addition, since the substrate is held by the substrate holder which is electrically insulated and the potential of the substrate is a floating potential, the potential difference in the vicinity of the substrate is made comparatively small, so that the ion bombardment by positive ions is greatly reduced, thereby enabling the formation of a dense thin film having few defects.

As for the substrate holder of the third apparatus, the substrate holder may be made of an electrically insulating material, or the substrate holder may be made of an electrically conductive material and disposed in said vacuum container through an electrically insulating material.

The first object can be also obtained by a fourth apparatus of the present invention, that is, an apparatus for forming a thin film comprising:

a vacuum container to which an active gas, an inert gas or a mixture thereof is introduced;

a source of evaporation for evaporating a substance being evaporated in said vacuum container;

a counter electrode disposed in said vacuum container and holding a substrate for forming a thin film thereon in such a manner as to be opposed to said source of evaporation;

a grid disposed between said source of evaporation and said counter electrode and having openings which allow said substance being evaporated to pass therethrough;

a filament for thermionic emission disposed between said grid and said source of evaporation; and a power source means for impressing said counter electrode with the same potential as or a negative potential relative to the potential of said source of evaporation and impressing said grid with an alternating potential.

According to the fourth apparatus of the present invention, since the alternating current is applied to the grid, and the electric field between the grid and the substrate and the electric field between the grid and the source of evaporation, the former and the latter electric fields being set in the opposite directions to each other, are periodically changed in accordance with the frequency of the grid potential, the ionization of the substance evaporated from the source of evaporation is carried out in a very high state by the thermions from the filament, so that it is possible to form a thin film excellent in adhesion, evenness of the surface and crystallinity on the substrate. At this time, since high energy is produced by the high ionization, it is possible to form a film at a low temperature without being provided with heat energy, so that a substrate which is inferior in heat resistance such as a plastic sheet, etc. is usable.

According to the present invention, the second object can be obtained by a fifth apparatus of the present invention, that is, an apparatus for forming a thin film comprising:

a vacuum container to which an active gas, an inert gas or a mixture thereof is introduced;

a source of evaporation which evaporates a substance being evaporated in said vacuum container and which also serves as a filament for thermionic emission;

a counter electrode disposed in said vacuum container and holding a substrate for forming a thin film thereon in such a manner as to be opposed to said source of evaporation;

a grid disposed between said source of evaporation and said counter electrode and having openings which allow said substance being evaporated to pass therethrough; and a power source means for establishing a predetermined electric potential relationship between said source of evaporation and said grid in which the potential of said grid is positive relative to the potential of said source of evaporation.

According to the fifth apparatus of the present invention, since the ionization of the substance evaporated from the source of evaporation is carried out in a very high state by the thermions from the source of evaporation, it is possible to form a thin film excellent in adhesion, evenness of the surface and crystallinity on a substrate. At this time, since high energy is produced by the high ionization, it is possible to form a film at a low temperature without being provided with heat energy, so that a substrate which is inferior in heat resistance such as a plastic sheet, etc. is usable. In addition, it is possible to form a good thin film of even a high-melting material or a compound thereof easily and at a low cost.

As for the source of evaporation of the first, second and third apparatuses, it is preferred that the source of evaporation is heated by a heat power source means in a state of being electrically floated from the other elements. In such a preferred case, no thermions are emitted from the source of evaporation and all thermions are emitted from the filament, so that good film formation is enabled in a stable plasma state.

As for the grid of the first, second, third, fourth and fifth apparatuses, it is preferred that the grid has a flat surface or a curved surface and the area of the opening per unit area is varied in the plane of the grid. In such a preferred case, the density of the evaporated particles which pass through the grid can be adjusted, whereby the thickness distribution of the thin film formed on the substrate can be made excellent in uniformity in the thickness distribution. In this case, it is also possible to form a thin film having a uniform thickness distribution on the large surface even if the substrate has a flat surface, a curved surface or a large area surface. This apparatus is therefore suitable for the formation of an optical thin film. In addition, this merit is brought about merely by improving the structure of the grid, the structure of the apparatus as a while is very simplified and economical. Furthermore, by relatively moving the grid and the substrate holder, it is possible to form a thin film having a uniform thickness without being influenced by the shadow of the grid.

According to the present invention, the third object can be obtained by a method of forming a zinc-oxide-base transparent conductive film using an apparatus for forming a thin film provided with a vacuum container to which an active gas, an inert gas or a mixture thereof is introduced; a source of evaporation for evaporating a substance being evaporated in said vacuum container; a counter electrode disposed in said vacuum container and holding a substrate for forming a thin film thereon in such a manner as to be opposed to said source of evaporation; a grid disposed between said source of evaporation and said counter electrode and having openings which allow said substance being evaporated to pass therethrough; a filament for thermionic emission disposed between said grid and said source of evaporation; and a power source means for establishing a potential relationship between said grid and said filament in which the potential of said grid is positive relative to the potential of said filament, said method characterized in that the pressure of oxygen gas or a mixture of oxygen gas and argon gas introduced in said vacuum container is in the range of $10^1$ to $10^{-2}$ Pa; said substance being evaporated is zinc, zinc and aluminum, a zinc aluminum alloy, or an oxide thereof; the voltage applied to said grid is in the range of 15 to 300 V; the film-forming rate is 1 to 50 Å/sec, and the temperature of said substrate is not lower than 80° C.

According to the method of forming a transparent conductive film of the present invention, it is possible to form a good zinc-oxide-base transparent conductive film with good reproducibility while controlling the electric conductivity and the transmittance thereof, which are the main film properties, by the mixing ratio of an introducing gas, the pressure thereof, the voltage applied to the grid, the film-forming rate and the like. This method is expected to greatly contribute to the field of optical technique in which use of plastic optical parts will be increased more and more.

The above and other objects, features and advantages of the present invention will become clear from the following description of the preferred embodiments thereof, taken in conjunction with the accompanying drawings.

DESCRIPTION OF THE PREFERRED EMBODIMENTS

Embodiments of the present invention will be explained hereinunder with reference to the accompanying drawings.

Figure 1:
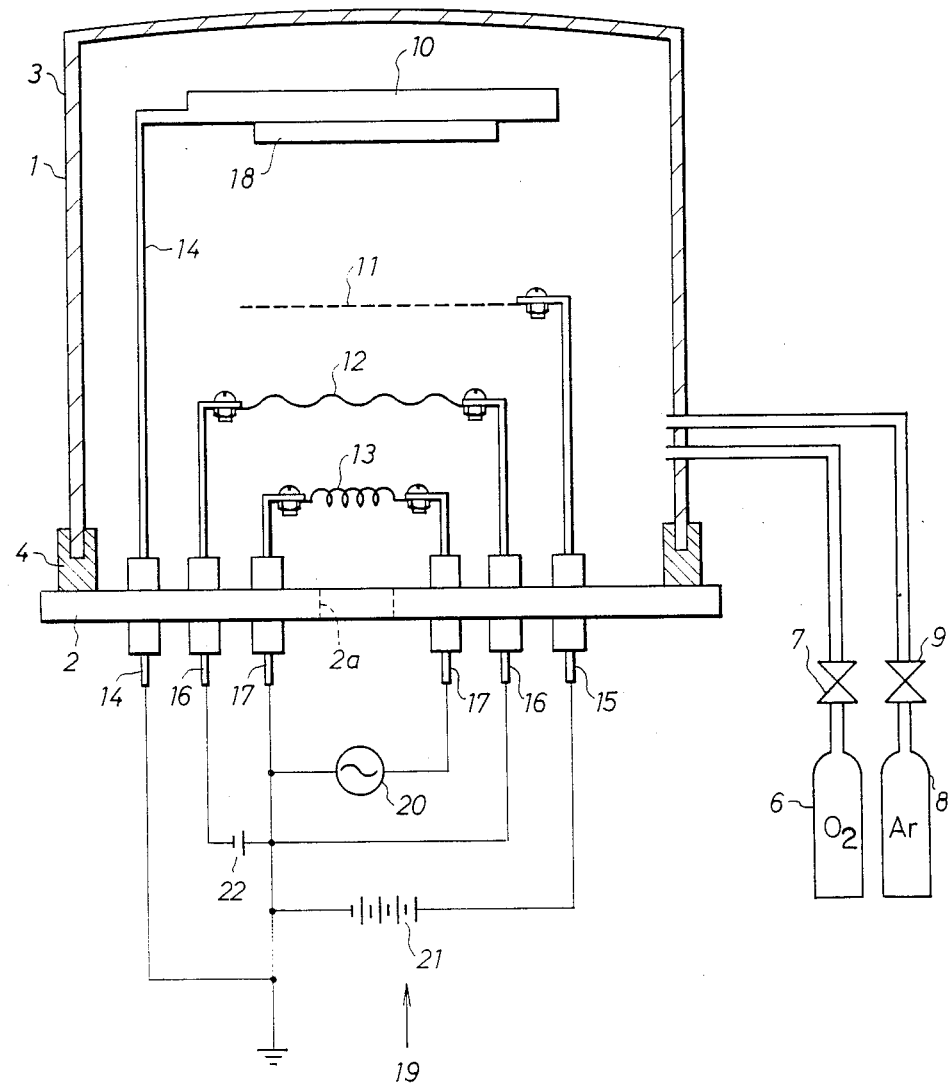
FIG. 1 is a schematic elevational view of an embodiment according to the first apparatus of the present invention.

An embodiment of a first apparatus of the present invention will first be explained with reference to FIG. 1. In FIG. 1, the reference numeral 1 denotes a vacuum container. The vacuum container 1 is composed of a base plate 2 and a bell jar 3 integrally provided on the base plate 2 through a packing 4. The base plate 2 has a hole 2a at the central portion thereof and is connected to an evacuation system (not shown) via the hole 2a in such a manner as to introduce an active gas, an inert gas or a mixture of an active gas and an inert gas while maintaining the airtightness in the vacuum container 1. For example, to the vacuum container 1 a bomb 6 accommodating an active gas such as $O_2$ is connected through a valve 7, and a bomb 8 accommodating an inert gas such as Ar is connected through a valve 9.

In the vacuum container 1, a counter electrode 10, a grid 11, a filament 12 and a source of evaporation 13 are disposed with an appropriate space therebetween in that order from the top to the bottom. These members 10, 11, 12 and 13 are supported by the electrodes 14, 15, 16 and 17, respectively, which also serve as supporters. These electrodes 14 to 17 extend to the outside of the vacuum container 1 through the base plate 2 while being kept electrically insulated from the base plate 2. These electrodes 14 to 17 electrically connect and feed the members inside and outside of the vacuum container 1 and can constitute the electrically conducting means together with other wiring means. Airtightness is secured at the portions through which the electrodes 14 to 17 extend to the outside of the vacuum container 1.

The source of evaporation 13 held by the pair of electrodes 17 is a means for evaporating a substance being evaporated and has a resistance heating system composed of a metal such as tungsten and molybdenum formed into a coil. The metal may be formed into a shape of a boat or a ribbon in place of a coil. Alternatively, it may be a source of evaporation using electron beams which are used in a conventional vacuum evaporation system.

The counter electrode 10 which is held by the electrode 14 holds a substrate 18 for forming a thin film thereon by an appropriate means on the surface (undersurface) of the counter electrode 10 which opposes the source of evaporation 13.

The filament 12 supported by the pair of electrodes 16 generates thermions and is made of tungsten or the like. The filament 7 is composed of, for example, a plurality of filaments arranged in parallel or reticulately and is so designed as to cover the spread of the material vapor evaporated from the source of evaporation 13.

The grid 11 supported by the electrode 15 is so designed as to have spaces which allow the substance being evaporated to pass therethrough. For example, the grid 11 has a reticulate configuration.

A power source means 19 for establishing a predetermined potential relationship between the counter electrode 10, the grid 11, the filament 12, the source of evaporation 13 and other members provided in the vacuum container 1 is disposed outside the vacuum container 1 and connected to each member through the electrodes 14 to 17.

The source of evaporation 13 is connected to an AC power source 20 for heating through the electrodes 17. A DC power source 21 is provided, and the positive electrode side of the DC power source 21 is connected to the grid 11 via the electrode 15. The filament 12 is connected to both ends of a DC power source 22 via the pair of electrodes 16. Although the positive electrode side of the DC power source 22 is grounded in FIG. 1, the negative electrode side may be grounded instead. Alternatively, an AC power source may be used. In any case, the potential of the filament 12 is set to be lower than the potential of the grid 11. The electrode 14 for the counter electrode 10 is grounded. In relation to the grid 11, the electrode 14 is connected to the negative side of the DC power source 21, thereby ensuring the potential relationship in which the potentials of the counter electrode 10 and the filament 12 are negative relative to the potential of the grid 11. These power sources 20 to 22 constitute the power source means 19, but the grounding shown in FIG. 1 is not necessarily required.

Actually, these electrical connections include various switches and by operating these switches the film forming process is executed on the substrate 18, but these switches are omitted here.

A method of forming a thin film using the apparatus of this embodiment will now be explained.

The substrate 18 for forming a thin film thereon is first set and supported by the counter electrode 10, as shown in FIG. 1, and a substance being evaporated is held by the source of evaporation 13. The substance being evaporated is determined depending on the kind of a thin film to be formed. For example, a metal such as aluminum and gold, an oxide, fluoride or sulfate of a metal, or an alloy is used. To the vacuum container 1, an active gas, an inert gas or a mixture thereof is introduced in advance at a pressure of 10 to $10^{-3}$ Pa. It is also possible to evacuate the vacuum container 1 in advance to a pressure of $10^{-4}$ to $10^{-7}$ Pa and introduce a gas at a pressure of 10 to $10^{-3}$ Pa, if necessary. It is assumed here that the introduced gas is an inert gas such as argon Ar.

If this apparatus is operated in this state, the substance being evaporated which is held by the source of evaporation 13 evaporates when heated. The evaporated substances, namely, the particles of the substance being evaporated fly upward dispersively toward the substrate 18 and pass through the grid 11.

Thermions are emitted from the filament 12 which is heated by the DC power source 20. Since the potential of the grid 11 is higher than the potential of the filament 12, the thermions emitted from the filament 12 are accelerated by the electric field and reach the vicinity of the grid 11 with the energy which corresponds to the potential difference between the grid 11 and the filament 12.

When the thermions hit on the particles of the evaporated substance and the introduced gas existing in the space in the vicinity of the grid 11, the thermions ionize these particles. Thus, a plasma state of high density is realized in the space in the vicinity of the grid 11.

Since the thermions from the filament 12 are emitted in the state in which the thermions have a kinetic energy which corresponds to the temperature of the filament 12, they are not immediately absorbed by the grid 11 having a positive potential but first pass through the grid 11. Thereafter, they are brought back to the grid 11 by the Coulomb attraction, and pass through the grid 11 again. Such vibrating movement is repeated around the grid 11 and most of the thermions are absorbed by the grid 11.

Therefore, the ionization of the partially evaporated substance which passes through the grid 11 is further accelerated by the collision with the thermions which keep on the vertical vibrating movement in the vicinity of the grid 11 and the collision with the ionized introduced gas. The part of the evaporated substance which has passed through the grid 11 and has not yet been ionized is ionized to cations by the collision with the ionized introduced gas between the grid 11 and the substrate 18, thereby further enhancing the ionization ratio.

The thus-ionized evaporated substance flies toward the substrate 18 while being accelerated by the action of the electric field directed from the grid 11 to the counter electrode 10, and impinges upon the substrate 18 at a high speed, thereby forming a desired thin film on the substrate 18. Since the thin film is obtained by the ionization of the evaporated substance, the thin film has good adhesion with the substrate 18 and good crystallinity and orientation property.

As described above, according to this embodiment, since the ionization ratio of the evaporated substance is very high, even when a thin film of a compound is formed by combining the evaporated substance with an active gas while introducing the active gas singly or together with an inert gas into the vacuum container 1, it is easy to obtain a thin film having desired physical properties.

For example, if argon Ar is introduced as an inert gas and $O_2$ as an active gas while adjusting the pressure of the vacuum container 1 to $10^{-1}$ to $10^{-2}$ Pa and aluminum Al is selected as a substance being evaporated, a thin film of $Al_2O_3$ is formed on the substrate 18. If Si or SiO is selected as a substance being evaporated, a thin film of $SiO_2$ is obtained. If In and Zn are selected as a substance being evaporated, thin films of $InO_2$ and ZnO, respectively are obtained. If $H_2S$ is selected as a gas and Cd as a substance being evaporated, a thin film of CdS is obtained. If ammonia is used together with argon as an active gas, and Ti or Ta is selected as a substance being evaporated, a thin film of TiN or TaN can be obtained.

In this embodiment, since the thermions from the filament 12 effectively contribute to the ionization of the evaporated substance and the introduced gas, the ionization of the evaporated substance is possible even in a high vacuum of not more than $10^{-2}$ Pa. Only a few gas molecules are therefore taken into the thin film formed, thereby forming a thin film of high purity. It is also possible to make the structure of a thin film very dense. Although it is generally said that the density of a thin film is lower than that of the bulk, a thin film having a density substantially equal to that of the bulk is provided according to this embodiment. As a result, since a thin film formed by the first apparatus of the present invention has uniform thickness and resistance, this apparatus is very suitable for the formation of semiconductor thin films constituting LSIs, ICs, etc., metal thin films of high purity which are used as the electrodes thereof, and optical thin films.

In short, this apparatus can be said to be a completely new apparatus which can realize both the merit of CVD and the merit of PVD, the former being that it is possible to provide a thin film with strong reactivity and the latter being that film formation is executed in a high vacuum which enables the formation of a dense and strong thin film. Since the evaporated substance is ionized and has electrically high energy (electron temperature and ion temperature), it is possible to realize the film formation which requires reactivity and crystallization without providing heat energy in the form of temperature (reaction temperature and crystallization temperature), thereby enabling film formation at a low temperature. A plastic sheet or the like having a low heat resistance may therefore be used as the substrate 18. The improvement of the productivity of ICs LSIs, etc. and the quality of an optical thin film is therefore achieved, so that it is applicable to the semiconductor and optical fields.

Figure 2:
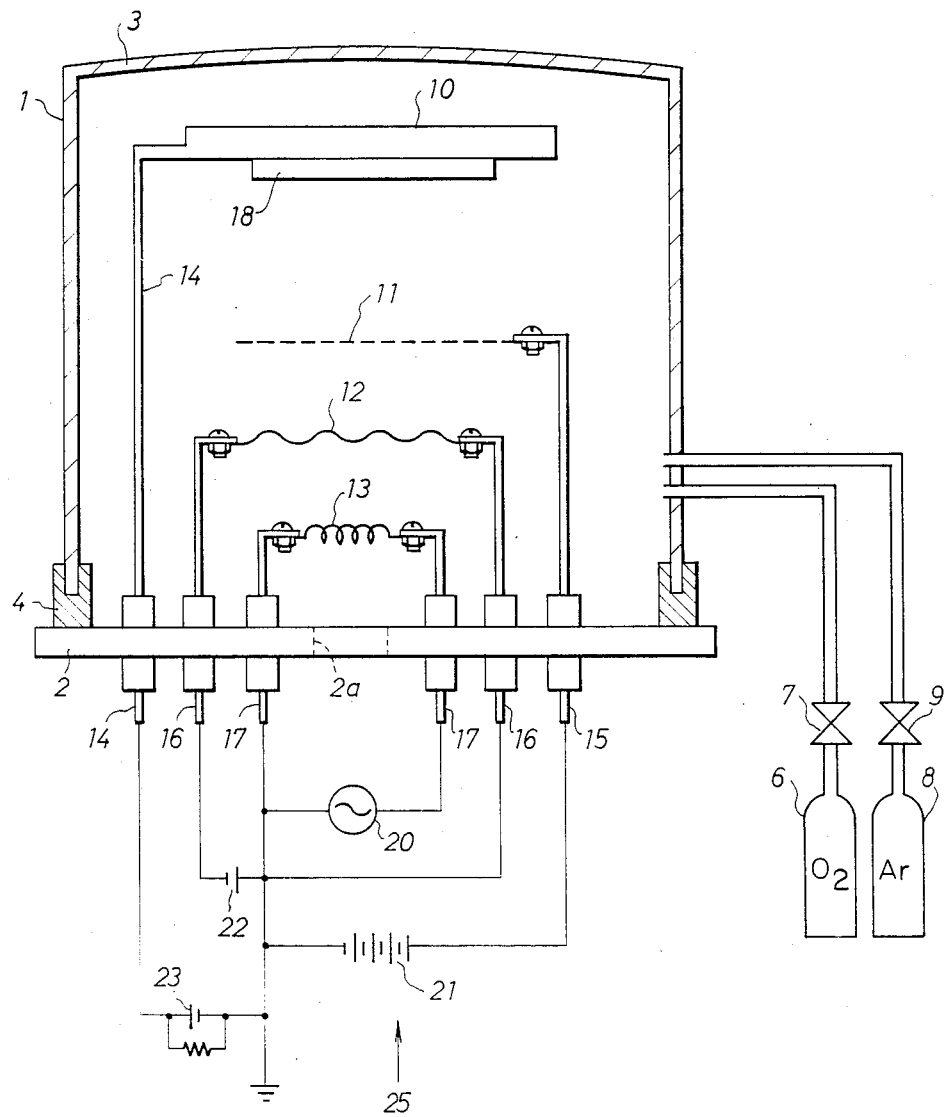
FIG. 2 is a schematic elevational view of an embodiment according to the second apparatus of the present invention.

An embodiment of the second apparatus of the present invention will be explained with reference to FIG. 2. The same numerals are provided for the elements which are the same as those in FIG. 1 and explanations thereof will be omitted. In this embodiment, the positive electrode side of a DC power source 23 is connected to the electrode 14 for the counter electrode 10. The negative electrode side of the DC power source 23 is connected to the negative electrode side of the DC power source 21. The negative electrode side of the DC power source 21 is connected to the positive electrode side of the DC power source 22 which is connected to one end of the filament 12, whereby the potential of the counter electrode 10 is set to be positive relative to the potential of the filament 12. The potential of the counter electrode 10 is lower than the potential of the grid 11. In this way, the electric potential relationship in which the potential of the counter electrode 10 is negative relative to the potential of the grid 11 and positive relative to the potential of the filament 12 is ensured. These power sources 20 to 23 constitute a power source means 25, but the grounding shown in FIG. 2 is not necessarily required.

In the formation of a thin film using an apparatus having the above-described structure, the ionized evaporated substance flies toward the substrate 18 while being accelerated by the action of the electric field directed from the grid 11 to the counter electrode 10, and impinges upon the substrate 18 at a high speed in the same manner as in the case of using the first apparatus. In this embodiment, since the potential of the counter electrode 10 is higher than the potential of the filament 12, the thermions reach the substrate 18 and activate it, thereby forming a desired thin film on the substrate 18. Since such a thin film is obtained by the ionization of the evaporated substance, the thin film has good adhesion with the substrate 18 and good crystallinity and orientation property.

As described above, according to this embodiment, since the ionization ratio of the evaporated substance is very high as in the case of using the first apparatus, even when a thin film of a compound is formed by combining the evaporated substance with an active gas while introducing the active gas singly or together with an inert gas to the vacuum container 1, it is easy to obtain a thin film having desired physical properties. According to the second apparatus, it is possible to form a dense thin film having a high purity as in the case of using the first apparatus. Since the thickness and the resistance of the thin film are uniform, this apparatus is very suitable for the formation of semiconductor thin films constituting LSIs, ICs, etc., metal thin films of high purity which are used as the electrodes thereof, and optical thin films.

Since film formation at a low temperature is enabled, it is possible to use a plastic sheet or the like, which is inferior in the heat resistance, as the substrate 18. Especially, since the surface of the substrate is activated by the thermions, the above-described various effects are further improved.

Figure 3:
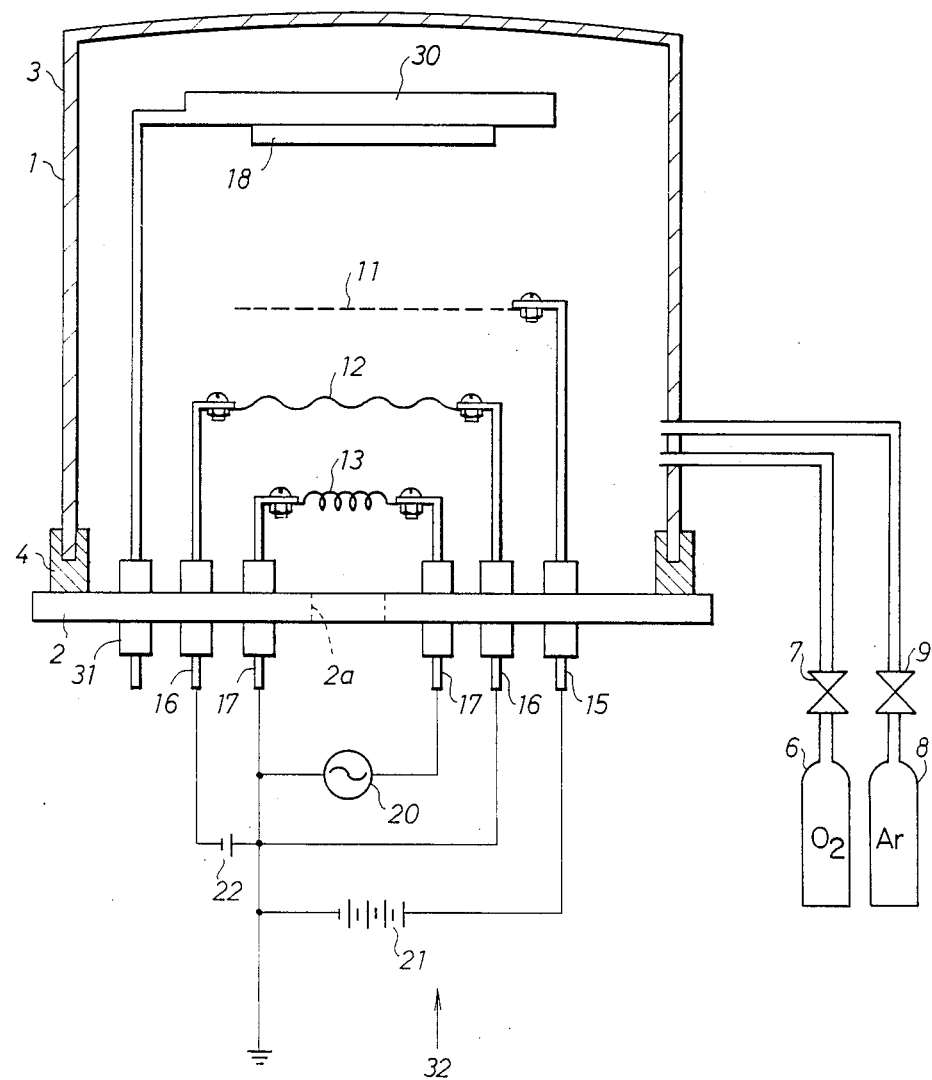
FIG. 3 is a schematic elevational view of an embodiment according to the third apparatus of the present invention.

An embodiment of the third apparatus of the present invention will now be explained with reference to FIG. 3. The same numerals are provided for the elements which are the same as those in FIG. 1, and explanation thereof will be omitted.

In this embodiment, a substrate holder 30 holds the substrate 18 in place of the counter electrode 10 of the first apparatus. The substrate holder 30 is held in a horizontal state in the vacuum container 1 through a supporter 31. The supporter 31 extends to the outside of the vacuum container 1 through the base plate 2 while being kept electrically insulated from the base plate 2. Airtightness is secured at the portions through which the supporter 3 extends to the outside of the vacuum container 1. A power source means 32 for establishing a predetermined potential relationship between the grid 11, filament 12, source of evaporation 13 and other members provided in the vacuum container 1 is disposed outside the vacuum container 1 and connected to the respective members through the electrodes 15 to 17. The potential of the grid 11 is set to be positive relative to the potential of the filament 12.

The substrate holder 30, which is connected to the supporter 31 which is kept electrically insulated from the base plate 2, may be made of either an electrically conductive material such as aluminum (in other words, a similar material as a material of the electrode 15, etc.) or a material having electrically insulating property such as TEFLON (trade name) and glass. In the case of using an electrically insulating material, the supporter 31 is not indispensable. In any case, the potential of the substrate 18 supported by the substrate holder 30 is kept in the state of a floating potential.

When a thin film is formed by the apparatus having this structure, the ionized evaporated substance passes through the grid 11, and the ionization of the substance to cations is further accelerated by the ionized gas. The ions are then accelerated toward the substrate 18 by the action of the electric field directed from the grid 11 to the substrate 18 in the same ways as in the case of using the first apparatus. In this embodiment, since the substrate holder 30 is in the electrically insulated state and the potential of the substrate 18 is a floating potential, most of the ions impinge on the surface of the substrate 18 at an energy less than the least energy (several ten eV) that is necessary for sputtering the atoms on the surface of the substrate 18. Since such a floating potential is low relative to the potential of the plasma space, the electric field in the vicinity of the substrate 18 is also directed from the grid 11 to the substrate 18 and does not prevent the movement of the ions which proceed toward the substrate 18. The ions therefore freely proceed toward the substrate 18. A part of the electrons in the vicinity of the substrate 18, which have been produced at the time of ionizing the evaporated substance and the introduced gas, reach the substrate 18 against the electric field in the vicinity of the substrate 18. In this way, according to the present invention, since the ions which are implanted at such a high energy as to damage a thin film are very few and ions are sufficiently supplied to the substrate 18 at a low energy, it is possible to form a thin film having a very good adhesion with the substrate 18, so that a material having a low heat resistance is also usable as the substrate. 18.

As described above, according to this embodiment, since the ionization ratio of the evaporated substance is very high, even when a thin film of a compound is formed by combining the evaporated substance with an active gas while introducing the active gas singly or together with an inert gas to the vacuum container 1, it is easy to obtain a thin film having desired physical properties as in the case of using the first apparatus. Since the thickness and the resistance of the thin film formed by the third apparatus are uniform, this apparatus is very suitable for the formation of semiconductor thin films constituting LSIs, ICs, etc., metal thin films of high purity which are used as the electrodes thereof, and optical thin films as in the case of using the first apparatus. Since film formation at a low temperature is enabled, it is also possible to use a plastic sheet or the like, which is inferior in the heat resistance, as the substrate 18. Especially, since the potential of the substrate is a floating potential, the potential difference in the vicinity of the substrate 18 is comparatively small and the ion bombardment by cations are very small, so that a dense thin film having few defects is formed.

An embodiment of the fourth apparatus of the present invention will now be explained with reference to FIG. 4. The same numerals are provided for the elements which are the same as those in FIG. 1, and explanation thereof will be omitted.

The source of evaporation 13 is connected to both ends of the AC power source 20 for heating which is a member of a power source means 43, through the electrodes 17. The filament 12 is connected to both ends of an AC power source 40 through the electrodes 16. The grid 11 is connected to one end of an AC power source 41 which is also a member of the power source means 43 through the electrode 15. The AC power source 41 may be biased to positive relative to the ground potential by inserting an additional DC power source between the AC power source 41 and the ground in series. Thus, the grid 11 has an AC potential. In other words, the potential of the grid 11 periodically changes in accordance with the frequency of the AC power source 41. And the potential of the grid 11 may periodically change while positively biased by the additional DC power source. The electrode 14 for the counter electrode 10 is connected to the negative side of a DC power source 42 which is a member of the power source means 43. The DC power source 42 is not indispensable. In any case, the potential of the counter electrode 10 is set at the same or a negative potential relative to the potential of the source of evaporation 13.

Figure 4:
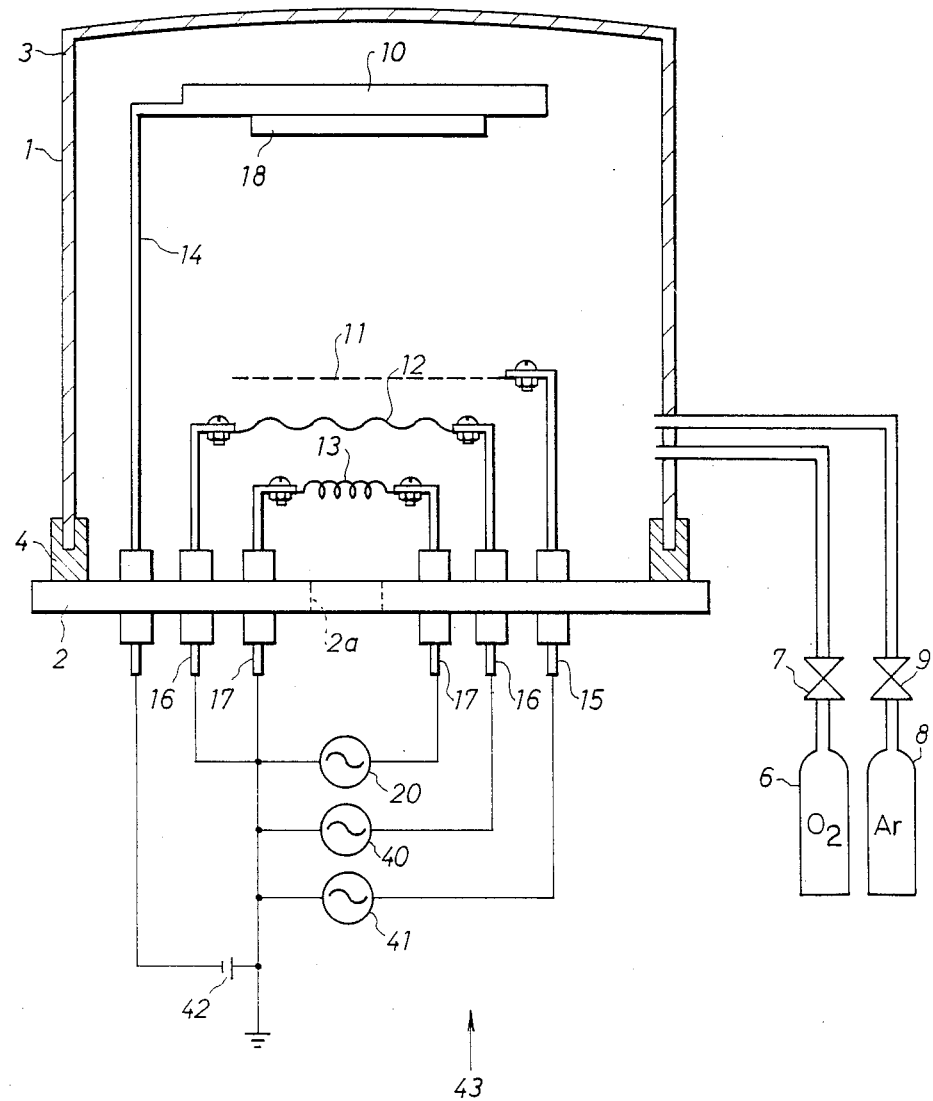
FIG. 4 is a schematic elevational view of an embodiment according to the fourth apparatus of the present invention.

Additionally, the grounding shown in FIG. 4 is not necessarily required. Actually, these electrical connections include various switches and by operating these switches the film forming process is executed on the substrate 18, but these switches are omitted here.

When a thin film is formed by the apparatus having this structure, the power source means 43 is actuated to apply an alternating current to the grid 11 and a negative potential to the counter electrode 10, whereby an alternating current flows on the filament 12 and the source of evaporation 13. The filament 12 is heated by resistance heating and emits thermions in the same way as in the case of using the first apparatus. The ionized evaporated substance reaches the grid 11. At this time, the electric field between the grid 11 and the substrate 18 and the electric field between the grid 11 and the source of evaporation 13, which are directed opposite to each other, periodically change in accordance with the frequency of the grid potential because an alternating current is applied to the grid 11 by the AC power source 41. Therefore, the evaporated substance keeps on vibrating movement between the grid 11 and the filament 12 due to an AC voltage applied to the grid 11. The collision of the evaporated substance with the thermions and the ionized introduced gas further accelerates ionization.

The part of the evaporated substance which has passed through the grid 11 and has not yet been ionized is ionized to cations between the grid 11 and the substrate 18 by the collision with the ionized introduced gas, thereby further enhancing the ionization ratio.

The thus-ionized evaporated substance flies toward the substrate 18, but since the mass of the evaporated substance is much larger than that of the electrons (even the mass of hydrogen ion which is the smallest is about 1800 times as large as the mass of an electron), the ions do not rapidly respond to a change in the potential between the grid 11 and the substrate 18 and finally impinge on and adhere to the substrate 18 with high energy. Thus, a thin film having a very good adhesion is formed on the substrate 18.

Most of the thermions are finally absorbed by the grid 11. More specifically, since the thermions are emitted from the filament 12 with a kinetic energy which corresponds to the temperature of the filament 12, when the grid potential is positive, the thermions are attracted by the grid 11, while when the grid potential is negative, they are repelled by the grid 11. In this way, the thermions keep on the vibrating motion between the filament 12 and the grid 11 while ionizing the evaporated substance and the introduced gas and are finally absorbed by the grid 11 without reaching the substrate 18. Consequently, the substrate 18 is free from the impact of the thermions and is prevented from the rise in the temperature which would otherwise be caused by being heated by the thermions. It is therefore possible to use a material having a low heat resistance such as a plastic material as the substrate 18.

As described above, according to this embodiment, since the ionization ratio of the evaporated substance is very high as in the case of using the first apparatus, even when a thin film of a compound is formed by combining the evaporated substance with an active gas while introducing the active gas singly or together with an inert gas to vacuum container 1, it is easy to obtain a thin film having desired physical properties. According to this embodiment, it is possible to form a dense thin film having a high purity as in the case of using the first apparatus. Since the thickness and the resistance of the thin film formed by the fourth apparatus are uniform, this apparatus is very suitable for the formation of semiconductor thin films constituting LSIs, ICs, etc., metal thin films of high purity which are used as the electrodes thereof, and optical thin films. Since film formation at a low temperature is enabled, it is possible to use a plastic sheet or the like, which is inferior in heat resistance, as the substrate 18. Especially, if a high-frequency power source which applies the potential of a high-frequency alternating current to the grid 11 is used as the AC power source, the ionization is further accelerated and the above-described various effects are further improved.

An embodiment of the fifth apparatus of the present invention will now be explained with reference to FIG. 5. The same numerals are provided for the elements which are the same as those in FIG. 1, and explanation thereof will be omitted.

In this embodiment, the counter electrode 10, the grid 11 and a source of evaporation 50 which also serves as a filament are provided with an appropriate space therebetween in the vacuum container 1. These members 10, 11 and 50 are respectively held by the electrodes 14, 15 and 17 which also function as the respective supporters.

The source of evaporation 50 held by the pair of electrodes 17 is a means for evaporating a substance being evaporated and also serves as a filament for generating thermions. The source of evaporation 50 has a resistance heating system composed of a high-melting and sublimate metal such as tungsten, molybdenum and tantalum formed into a coil. The metal may be formed into a shape of a boat, rod or line in place of a coil.

The DC power source 21 is provided as a power source means for establishing the potential relationship between the grid 11 and the source of evaporation 50 provided in the vacuum container 1 in which the potential of the grid 11 is positive relative to the potential of the source of evaporation 50. The positive electrode side of the DC power source 21 is connected to the grid 11 through the electrode 15, and the negative electrode side of the DC power source 21 is connected to the source of evaporation 50 via one of the electrodes 17, whereby the electric field directed from the grid 11 to the source of evaporation 50 is formed therebetween. Although the negative electrode side of the DC power source 21 is directly grounded in FIG. 5, a DC power source may be interposed between the DC power source 21 and the ground, thereby biasing the source of evaporation 50.

The AC power source 20 is connected between the electrodes 17 for the source of evaporation 50. The AC power source 20 may be replaced by a DC power source and the polarity may be determined as desired.

Figure 5:
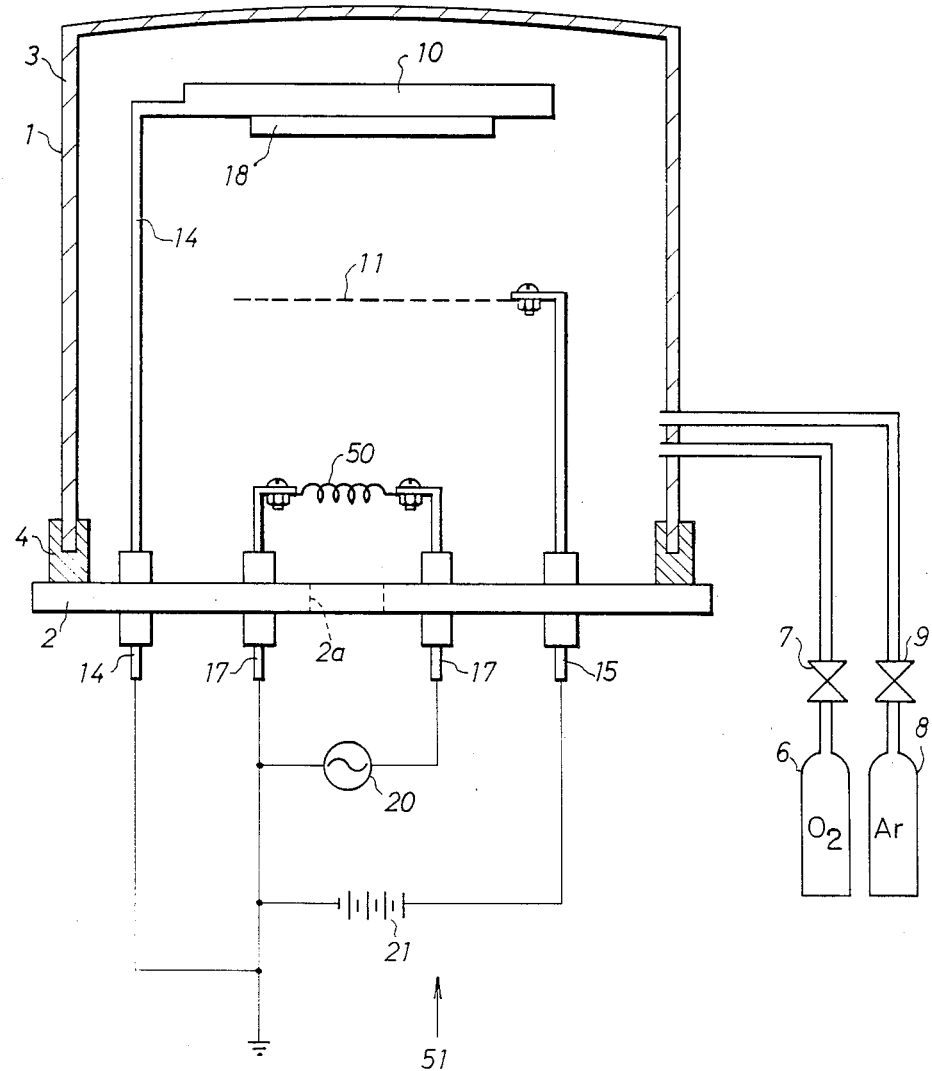
FIG. 5 is a schematic elevational view of an embodiment according to the fifth apparatus of the present invention.

Although the counter electrode 10 is directly grounded via the electrode 14 in FIG. 5, a DC power source may be interposed between the counter electrode 10 and the ground for biasing. The grounding in FIG. 5 is not necessarily required. These power sources constitute a power source means 51, and actually these electrical connections include various switches and by operating these switches the film forming process is executed on the substrate 18, but these switches are omitted here.

A method of forming a thin film using the apparatus of this embodiment will now be explained.

The substrate 18 is first set and supported by the counter electrode 10, and a substance being evaporated is held by the source of evaporation 50. The substance being evaporated is determined depending on the kind of a thin film to be formed. For example, a metal such as tungsten, molybdenum, tantalum and chromium, a metal compound such as titanium carbide and tantalum carbide or an alloy is appropriately used. To the vacuum container 1, an active gas, an inert gas or a mixture thereof is introduced in advance at a pressure of 10 to $10^{-3}$ Pa. For the convenience of explanation, it is assumed here that the introduced gas is an active gas such as oxygen.

If this apparatus is operated in this state, the substance being evaporated which is held by the source of evaporation 50 evaporates when heated by the power source 20. The evaporated substances, namely, the particles of the substance fly upward toward the substrate 18 and pass through the grid 11.

The source of evaporation 50, which also serves as a filament, also emits thermions. The thermions emitted from the source of evaporation 50 fly toward the grid 11 while being accelerated by the electric field of the grid 11 and collide with the particles of the introduced gas and the substance evaporated from the source of evaporation 50. The thermions ionize these particles to cations, thereby producing a plasma state in the space in the vicinity of the grid 11.

The thus-ionized evaporated substance and gas particles fly toward the substrate 18 while being accelerated by the action of the electric field directed from the grid 11 to the counter electrode 10, and impinge upon the substrate 18 at a high speed, thereby forming a desired thin film on the substrate 18. Since the thin film is obtained by the ionization of the evaporated substance, the thin film has good adhesion with the substrate 18 and good crystallinity and orientation property.

As described above, according to this embodiment, since the ionization ratio of the material vapor is very high, even when a thin film of a compound is formed by combining the evaporated substance with an active gas while introducing the active gas singly or together with an inert gas to the vacuum container 1, it is easy to obtain a thin film having desired physical properties. According to this embodiment, it is possible to form a dense thin film having a high purity as in the case of using the first apparatus. Since the thickness and the resistance of the thin film formed by the fifth apparatus are uniform, this apparatus is very suitable for the formation of semiconductor thin films constituting LSIs, ICs, etc., metal thin films of high purity which are used as the electrodes thereof, and optical thin films. Since film formation at a low temperature is enabled, it is possible to use a plastic sheet or the like, which is inferior in heat resistance, as the substrate 18.

Figure 6:
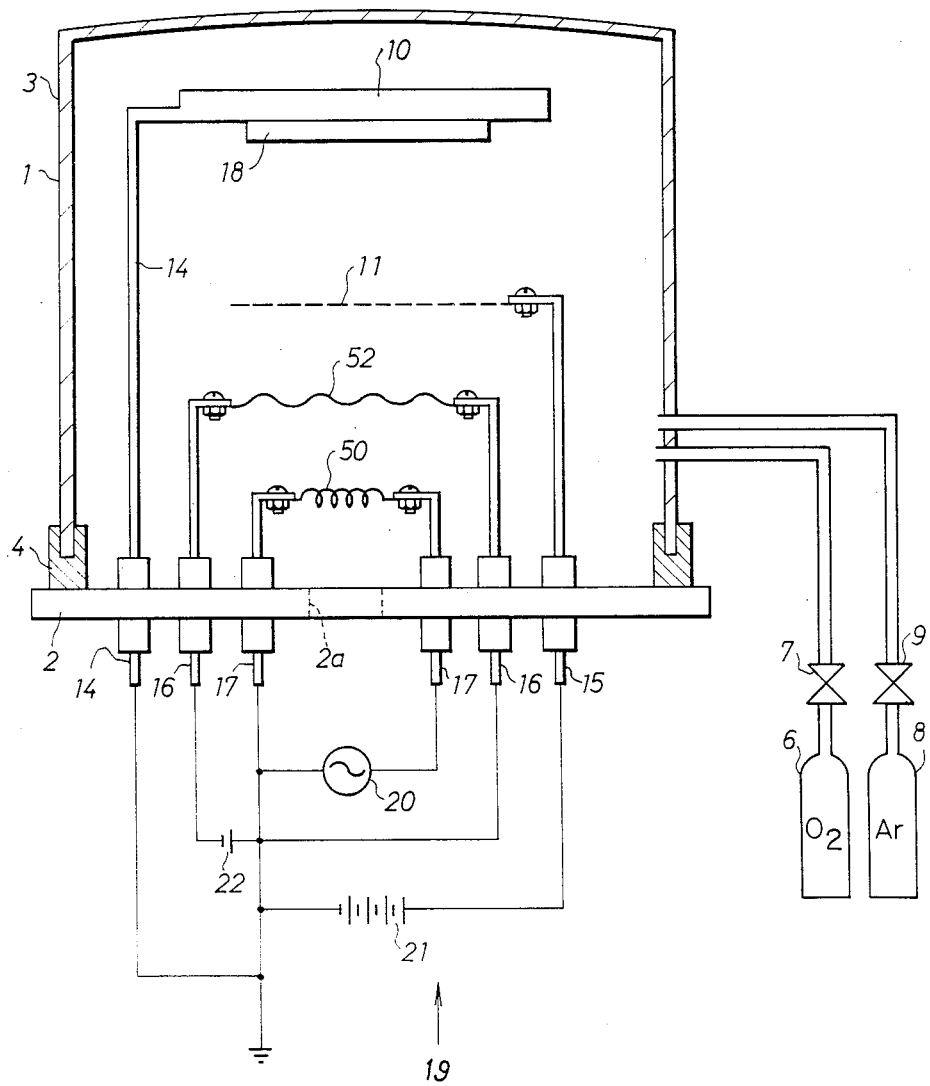
FIG. 6 is a schematic elevational view of another embodiment according to the fifth apparatus of the present invention.

FIG. 6 shows another embodiment of the fifth apparatus of the present invention. In this embodiment, an additional filament 52 is provided between the source of evaporation 50 which also serves as a filament and the grid 11. The filament 52 is supported by the pair of electrodes 16 which also serve as the supporters. Although a DC power source 22 is connected between the electrodes 16 in FIG. 6, it may be replaced by an AC power source. The electrode 16 is connected to the negative electrode side of the DC power source 21 such that the potential of the filament 52 is negative relative to the potential of the grid as the potential of the source of evaporation 50.

Figure 7:
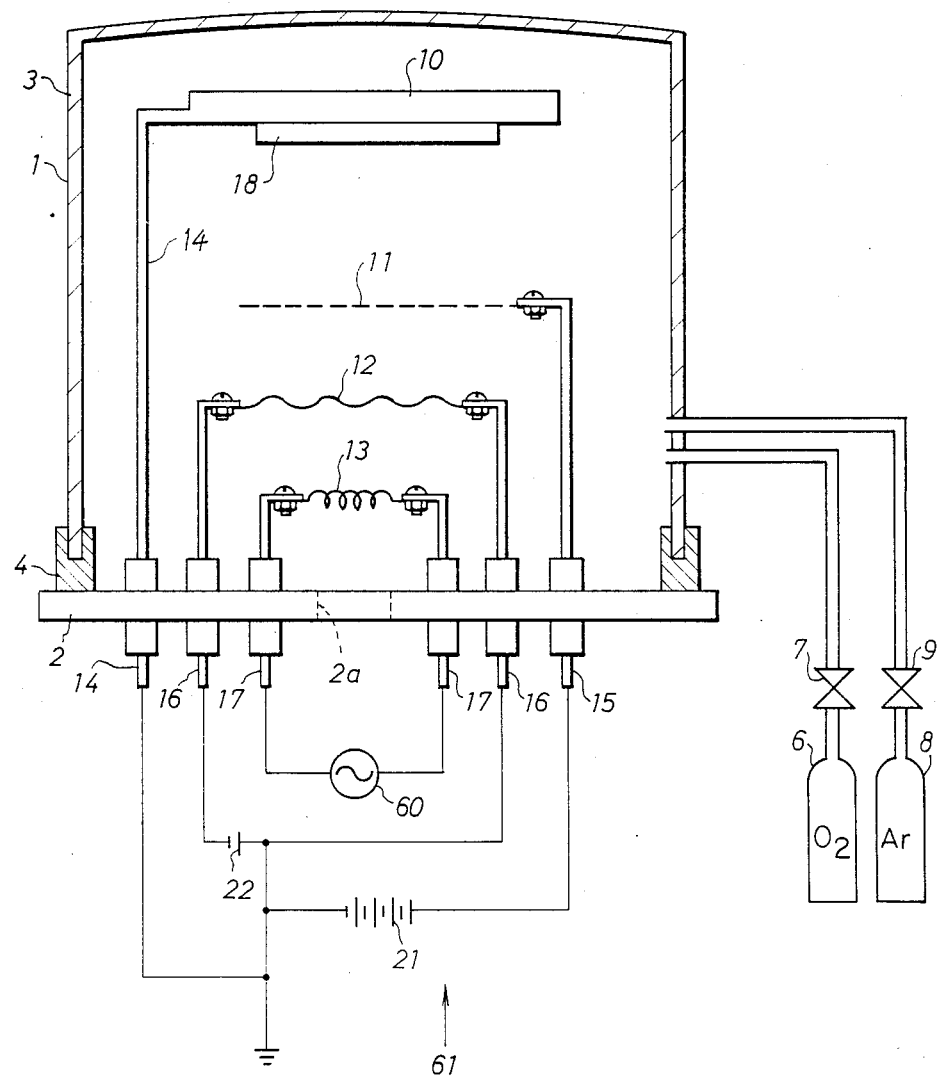
FIG. 7 is a schematic elevational view of another embodiment according to the first apparatus of the present invention.

Another embodiment of the first apparatus of the present invention will now be explained with reference to FIG. 7. The same numerals are provided for the elements which are the same as those in FIG. 1, and explanation thereof will be omitted.

This embodiment has the same structure as the embodiment shown in FIG. 1 except that in a power source means 61, an AC power source 60 for heating is connected between the electrodes 17 for the source of evaporation 13 floats electrically relative to the other members (including ground). In this embodiment, the power source 60 is not restricted to an AC power source and may be a DC power source (the polarity may also be determined as desired). In this structure, when the substance being evaporated is evaporated from the source of evaporation 13, almost no thermion is emitted therefrom.

A method of forming a thin film using the apparatus of this embodiment will now be explained. The method of forming a thin film by the apparatus of this embodiment is the same as in the case of using the first apparatus except that when the power source means 61 is actuated, thermions are only emitted from the filament 12 and not emitted from the source of evaporation 13. Consequently, according to this embodiment, it is possible to produce a stable plasma state in the space in the vicinity of the grid 11 merely by controlling the power sources 21 and 22.

As described above, this embodiment not only has the merits of the first apparatus but also is advantageous in that a stable plasma state is produced in the space in the vicinity of the grid 11 merely by controlling the power sources 21 and 22. Accordingly, even in forming a thin film of a high-melting and sublimate compound, a good thin film is obtained, so that this apparatus is very suitable for the formation of semiconductor thin films constituting LSIs, ICs, etc.

Another embodiment of the first apparatus of the present invention will now be explained with reference to FIG. 8. The same numerals are provided for the elements which are the same as those in FIG. 1, and explanation thereof will be omitted.

This embodiment has the same structure as the embodiment shown in FIG. 1 except for a grid 70. The grid 70 held by the electrode 15 in this apparatus has a flat surface or a curved surface (a flat surface in this embodiment), and has a configuration having openings 70a which allow the evaporated substance to pass therethrough. For example, the grid 70 has a reticulate configuration. The grid 70 is characterized by the area distribution of the openings 70a. The area of the openings 70a per unit area is varied in the plane of the grid 70. To state this more concretely, the grid 70 is so designed as to have larger openings 70a at the peripheral portion of the reticulate grid so that the area of the openings at the central portion of the grid 70 is smaller than the area of the openings at the peripheral portion. (In FIG. 8, the change in the area of the opening is emphasized.)

A method of forming a thin film using the apparatus of this embodiment will now be explained. The method of forming a thin film by the apparatus of this embodiment is the same as in the case of using the first apparatus except that the substance evaporated from the source of evaporation 13 passes through the grid 70. Since the area of the openings 70a per unit area is varied in the plane of the grid 70 so that the area of the openings at the central portion of the grid 70 is smaller than the area of the openings at the peripheral portion, the density of the particles of the evaporated substance which passes through the grid 70 and proceeds toward the substrate 18 is adjusted when the evaporated substance passes through the grid 70. Therefore, the thin film formed on the substrate 18 has an excellent uniformity in the thickness distribution.

To state this more concretely, it is assumed that the substrate 18 and the grid 70 have flat surfaces and a spot-like source of evaporation 13 is used. It is also assumed that the equal-thickness line of the thin film formed when the area of the opening 70a per unit area of the grid 70 is uniform in the plane of the grid 70 is a concentric circle, and that if the thickness is t, the function of the thickness distribution is represented by only a function of distance (r) from the center of the substrate 18, namely, $t(r)=f(r)$. Such a function of distribution is intrinsic to the structure of an apparatus. Accordingly, if the area of the opening 70a per unit area of the grid 70 is $\rho$, the distance from the center of the grid 70 is R, and a and c are constants intrinsic to the apparatus, it is possible to greatly reduce the nonuniformity of thickness by varying the areas of the openings so as to satisfy the relationship $\rho(R)=a/f(R/c)$.

If there still remains a minute nonuniformity of thickness which cannot be overlooked, it is possible to further reduce the nonuniformity of thickness by varying the areas of the openings so as to satisfy the relationship $\rho'(R)=\rho(R)(a/f'(R/c))$ on the assumption that the function of the thickness distribution which provides the nonuniformity of thickness is $f'(r)$ and the area of the opening 70a per unit area of the grid 70 is $\rho'$.

Although the substrate 18 has a shape of a flat disk in this embodiment, the substrate 18 may have another configuration, a curved surface such as a convex surface and a concave surface, and further a large area.

An additional heater may be provided to heat the substrate 18 so as to accelerate the reaction on the substrate at a temperature about 600° C., for example.

It is also possible to provide an additional electrode for ionization of the evaporated particles in the vacuum container 1 in order to accelerate the reaction.

According to this apparatus provided with a means for executing the known ion plating method by the ionization of the evaporated particles, if $MgF_2$ is selected as a substance being evaporated and argon is used as an introduced gas, for example, a thin film of a magnesium fluoride is formed. If Si or SiO is selected as a substance being evaporated, and oxygen and argon are used as an introduced gas, a thin film of $SiO_2$ is obtained.

As described above, this embodiment not only has the merits of the first apparatus but also is advantageous in that a more uniform thickness distribution is obtained by virtue of the action of the grid 70.

Another embodiment of the first apparatus of the present invention will be explained with reference to FIG. 9. This embodiment has the same structure as the embodiment shown in FIG. 8 except that the grid 70 is so designed as to move on a predetermined track. The same numerals are provided for the elements which are the same as those in FIG. 1, and explanation thereof will be omitted.

In this embodiment, the uniformity of the thickness distribution is further improved. In the case of the embodiment shown in FIG. 8 in which the improvement is carried out only by modifying the configuration of the grid 70, there is a possibility of the geometrical pattern drawn by the grid 70 producing a nonuniformity in the thickness of a thin film formed on the substrate 18.

Figure 8:
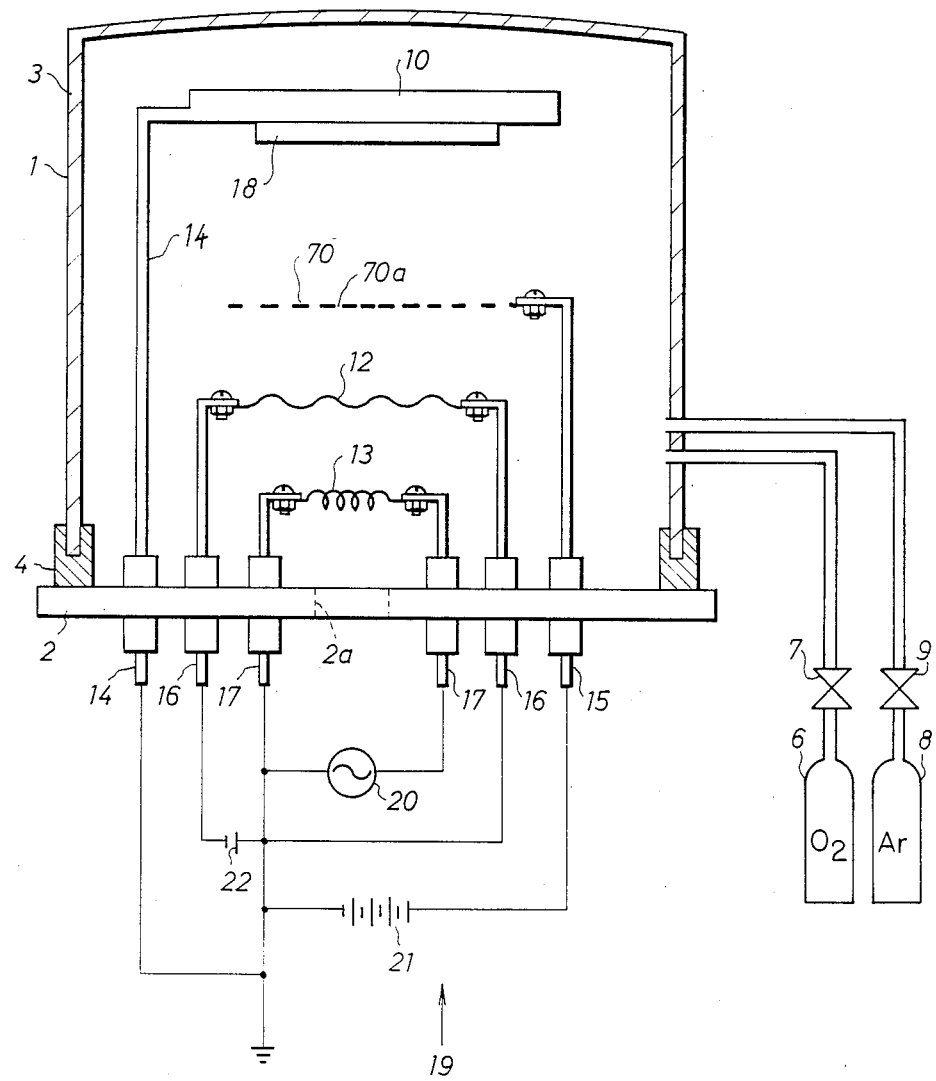
FIG. 8 is a schematic elevational view of another embodiment according to the first apparatus of the present invention.
Figure 9:
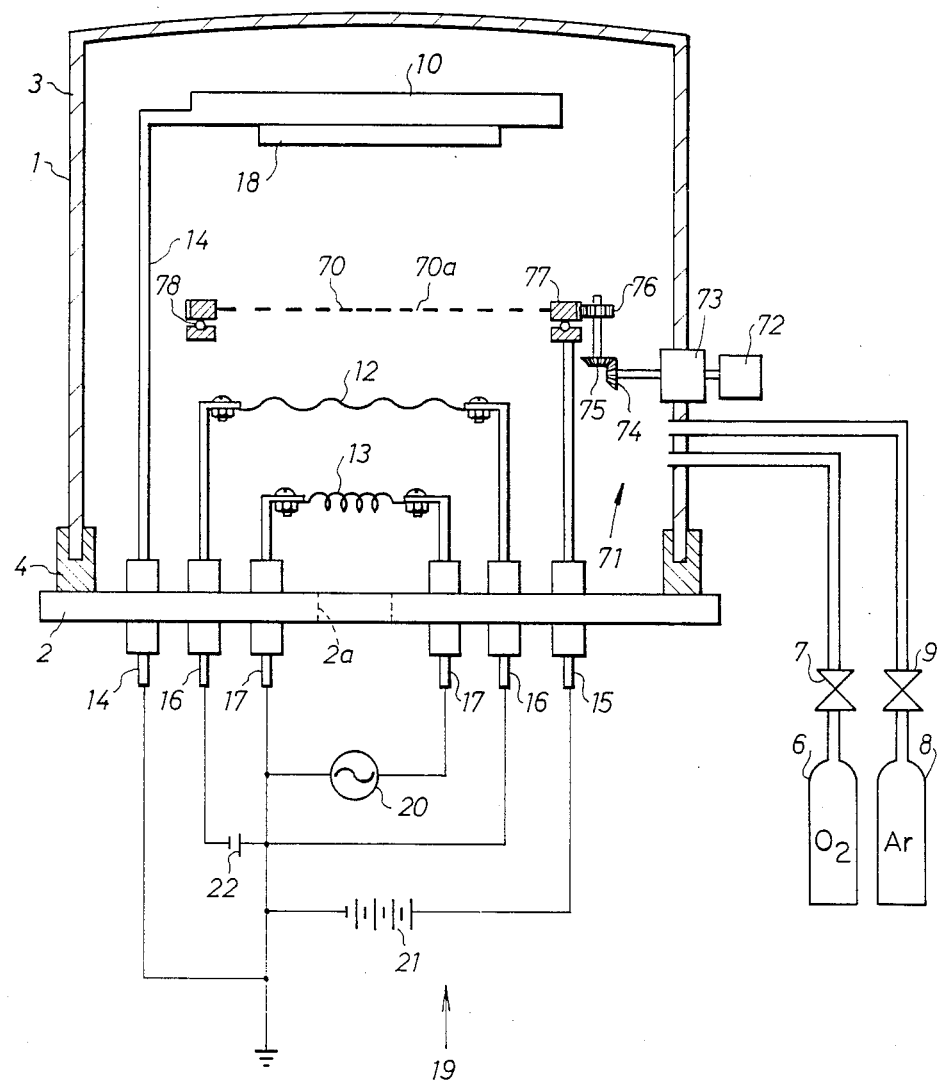
FIG. 9 is a schematic elevational view of another embodiment according to the first apparatus of the present invention.

In contrast, in this embodiment, the grid 70 having varied opening areas as in the embodiment shown in FIG. 8 is not provided in a fixed state but connected to a driving mechanism 71 in such a manner as to be moved on a predetermined track. That is, the grid 70 is moved relative to the substrate 18. The driving mechanism 71 may be any of the known rotation introducing machines, linear motion introducing machines or a combination thereof that allows the grid 71 to move on the track in the vacuum container 1 by rotary motion, linear motion or a combination thereof. In this embodiment, the power of a motor 72 disposed outside the vacuum container 1 is transmitted to the grid 70 through a rotation introducing device 73, bevel gears 74, 75, 76 and 77 and a bearing 78, thereby rotating the grid 70 on a predetermined track. More specifically, the grid 70 has the gear 77 which is supported in such a manner as to be rotatable in a horizontal plane through the bearing 78 with respect to the substrate 18 and which interlocks with the gear 76.

In this structure, when a thin film is formed in the same way as in the embodiment shown in FIG. 8, the grid 70 is rotated on a predetermined track by the driving mechanism 71. Therefore, a thin film having a uniform thickness over the entire surface is formed without producing the nonuniformity in the thickness which would otherwise be caused by the geometrical pattern drawn by the grid 70. In other words, the movement of the grid 70 such as rotation averages the influence of the geometrical pattern which has been drawn on the substrate 18 by the grid 70 on the shading of the evaporated particles. In this way, together with the effect of the configuration of the grid 70 having varied opening areas, the effect of moving the grid 70 further improves the uniformity of the thickness distribution.

The grid 70 and the substrate 18 are relatively moved by moving the grid 70 by the driving mechanism 71 in this embodiment. Alternatively, the grid 70 may be fixed and the counter electrode 10 may be movably connected to a driving mechanism, thereby moving the substrate 18 relative to the grid 70. In this case, the track for the substrate 18 need not be made complicated so long as it is capable of averaging the influence of the shadow portion of the grid 70.

An embodiment of the method of forming a transparent conductive film according to the present invention will be explained with reference to FIG. 10. According to this embodiment, a transparent conductive film is easily formed on the substrate while controlling the electric conductivity and the transmittance thereof by using an apparatus for forming a thin film which has been proposed by the Applicant in Japanese Patent Application Laid-Open (KOKAI) No. 59-89763 (1984).

Figure 10:
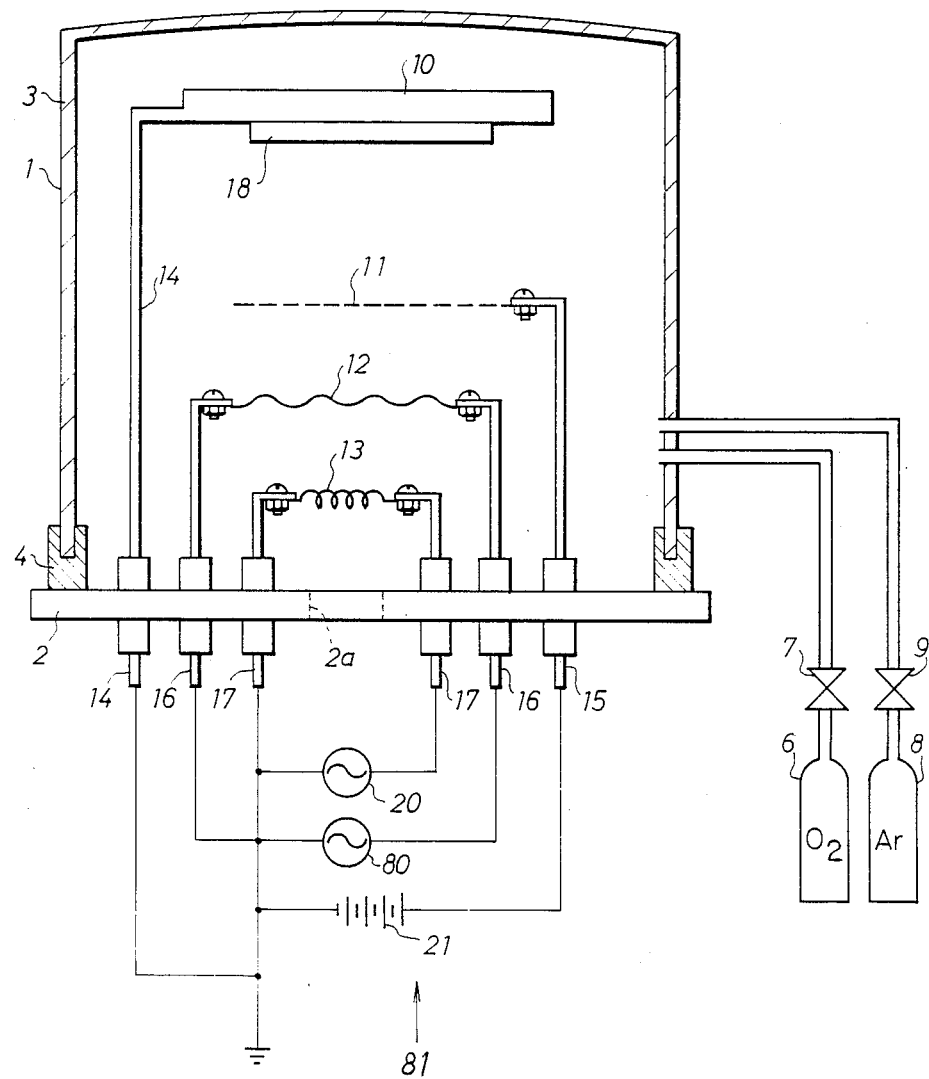
FIG. 10 is a schematic elevational view of an embodiment according to the method of forming a transparent conductive film of the present invention.

The same numerals are provided for the elements in FIG. 10 which are the same as those in FIG. 1, and explanation thereof will be omitted.

The apparatus used for this embodiment has the same structure as the embodiment shown in FIG. 1 except that the power source 22 is eliminated and an AC power source 80 for supplying a current to the filament 12 is added.

The substrate 18 is first set as shown in FIG. 10, and as the substances being evaporated, metal zinc, metal zinc and metal aluminum a zinc aluminum alloy or an oxide thereof is held by at least one source of evaporation 13. In this embodiment, metal zinc is used as the substance being evaporated and a tungsten boat is used as the source of evaporation 13.

The vacuum container 1 is evacuated in advance to $10^{-3}$ to $10^{-5}$ Pa, and oxygen gas is introduced thereto at a pressure of $10^0$ to $10^{-2}$ Pa singly or in the form of a mixture with an inert gas such as argon or a gas which is inert to zinc, e.g., nitrogen.

The power source means 81 is actuated in this state to apply a positive potential to the grid 11, ground the counter electrode 10 and energize the filament 12. In this embodiment, the grid 11 is reticulate and 30 V is applied to the grid 11. The filament 12 is made of a tungsten wire and a power of 400 W is applied thereto. The filament 12 is heated by resistance heating and emits thermions. The oxygen molecules and argon molecules in the vacuum container 1 are ionized by the collision with the thermions emitted from the filament 12. The evaporated zinc particles fly dispersively toward the substrate 18, and a part of them and the introduced gas are ionized by the collision with the thermions emitted from the filament 12.

The thus partially ionized zinc particles pass through the grid 11. During this time, they are further ionized by the collision with the thermions which vertically vibrate in the vicinity of the grid 11 as described above, or the introduced gas ionized as described above.

The part of the evaporated substance which has passed through the grid 11 and has not yet been ionized is further ionized to cations by the collision with the ionized introduced gas between the grid 11 and the substrate 18, thereby enhancing the ionization ratio.

Zinc which has been ionized to cations in this way is accelerated toward the substrate 18 by the action of the electric field directed from the grid 11 to the counter electrode 10 and proceeds toward the substrate 18 with high energy. Further, zinc combines with oxygen on the way to the substrate 18 or on the surface of the substrate 18, thereby forming a transparent conductive film of zinc oxide or aluminized zinc oxide on the substrate 18. In this embodiment, a transparent conductive film of zinc oxide is formed.

Most of the thermions are finally absorbed by the grid 11. A part of the thermions pass through the grid 11, but since they are decelerated between the grid 11 and the substrate 18 by the action of the above-described electric field, even if they reach the substrate 18, they do not have enough energy to heat the substrate 18.

The electric conductivity and the transmittance of a zinc oxide film and an aluminized zinc oxide film vary depending on the state in which zinc is combined with oxide, the ratio of zinc and aluminum, etc. For example, if the amount of evaporation of metal zinc is increased, a thin film having a low resistivity is formed. However, when a film is formed on a substrate of ordinary temperature under the same conditions, the transmittance is rapidly reduced because metal zinc is deposited on the substrate 18. If a film is formed under the condition that the temperature of the substrate 18 is not lower than 80° C., the metal zinc, which rapidly reduces the transmittance, is evaporated again when it reaches the substrate 18, so that a thin film having a high transmittance is formed on the substrate 18. In addition, the resistivity of the thin film is as low as $10^{-4} \Omega$ cm even when no aluminum is added.

As described above, according to this embodiment, it is possible to form a transparent conductive film having high electric conductivity and transmittance on the substrate 18 by using the apparatus shown in FIG. 10. It is also possible to vary the surface resistance and the transmittance of the film as desired by controlling the composition and the pressure of an introducing gas and the film-forming rate.

In this embodiment, since an apparatus for forming a thin film which is capable of producing a film having a good adhesion with the substrate 18 is used, as described above, it is possible to form a transparent conductive film having given resistance and transmittance on not only a glass substrate but also a plastic substrate or the like. It is therefore possible to provide a transparent conductive film which is very suitable as a transparent electrode for a display material, solar battery, antistatic film or the like which requires light weight, high impact resistance, etc.

From the general point of view, the conditions for film formation in the present invention are not restricted to the conditions described in the embodiments and generally good films are obtained in the experiments conducted under the conditions that the pressure of introduced gas is in the range of $10^1$ to $10^{-2}$ Pa, the voltage applied to the grid is in the range of 15 to 300 V and the film-forming rate is in the range of 1 to 50 Å/sec.

While there has been described what at present is considered to be preferred embodiments of the invention, it will be understood that various modifications may be made thereto, and it is intended that the appended claims cover all such modifications as fall within the true spirit and scope of the invention.

What is claimed is:

1. An apparatus for forming a thin film comprising:
   a vacuum container to which an active gas, an inert gas or a mixture thereof is introduced;
   a source of evaporation from which a substance is evaporated, disposed in said vacuum container;

a counter electrode disposed in said vacuum container and holding a substrate for forming a thin film thereon in such a manner as to be opposed to said source of evaporation;

a grid disposed between said source of evaporation and said counter electrode and having openings which allow said substance being evaporated to pass therethrough;

a filament for thermionic emission disposed between said grid and said source of evaporation; and a power source means for establishing a predetermined electric potential relationship between said grid, said counter electrode and said filament in which the potential of said counter electrode is negative relative to the potential of said grid and positive relative to the potential of said filament.

2. An apparatus according to claim 1, wherein said source of evaporation is heated by a heat power source means and floats electrically relative to the other elements.

3. An apparatus according to claim 1, wherein said grid has a flat surface or a curved surface and the area of said opening per unit area is varied in the plane of said grid.

4. An apparatus for forming a thin film comprising;
a vacuum container to which an active gas, an inert gas or a mixture thereof is introduced;

a source of evaporation from which a substance is evaporated, disposed in said vacuum container;

a counter electrode disposed in said vacuum container and holding a substrate for forming a thin film thereon is such a manner as to be opposed to said source of evaporation;

a grid disposed between said source of evaporation and said counter electrode and having openings which allow said substance being evaporated to pass therethrough;

a filament for thermionic emission disposed between said grid and said source of evaporation; and a power source means for impressing said counter electrode with the same potential as or a negative potential relative to the potential of said source of evaporation and impressing said grid with an alternating potential.

5. An apparatus according to claim 4, wherein said grid has a flat surface or a curved surface and the area of said opening per unit area is varied in the plane of said grid.

6. An apparatus for forming a thin film comprising:
a vacuum container to which an active gas, an inert gas or a mixture thereof is introduced;

a source of evaporation from which a substance is evaporated, disposed in said vacuum container, wherein said source of evaporation is heated by a heat power source means and floats electrically relative to the other elements;

a counter electrode disposed in said vacuum container and holding a substrate for forming a thin film thereon in such a manner as to be opposed to said source of evaporation;

a grid disposed between said source of evaporation and said counter electrode and having openings which allow said substance being evaporated to pass therethrough;

a filament for thermionic emission disposed between said grid and said source of evaporation; and a power source means for establishing a predetermined electric potential relationship between said grid, said counter electrode and said filament in which the potentials of said counter electrode and said filament are negative relative to the potential of said grid.

7. An apparatus for forming a thin film comprising:
a vacuum container to which an active gas, and inert gas or a mixture thereof is introduced;

a source of evaporation from which a substance is evaporated, disposed in said vacuum container;

a counter electrode disposed in said vacuum container and holding a substrate for forming a thin film thereon in such a manner as to be opposed to said source of evaporation;

a grid disposed between said source of evaporation and said counter electrode and having openings which allow said substance being evaporated to pass therethrough, wherein said grid has a flat surface or a curved surface and the area of said opening per unit area is varied in the plane of said grid;

a filament for thermionic emission disposed between said grid and said source of evaporation; and a power source means for establishing a predetermined electric potential relationship between said grid, said counter electrode and said filament in which the potentials of said counter electrode and said filament are negative relative to the potential of said grid.

8. An apparatus according to claim 7, further comprising a driving mechanism for relatively moving said grid and said substrate on a predetermined track in said vacuum container.

9. An apparatus for forming a thin film comprising:
a vacuum container to which an active gas, an inert gas or a mixture thereof is introduced;

a source of evaporation from which a substance is evaporated, disposed in said vacuum container, wherein said source of evaporation is heated by a heat power source means and floats electrically relative to the other elements;

a substrate holder disposed in said vacuum container for holding a substrate for forming a thin film thereon in such a manner as to be opposed to said source of evaporation and being electrically insulated from other elements;

a grid disposed between said source of evaporation and said substrate holder and having openings which allow said substance being evaporated to pass therethrough;

a filament for thermionic emission disposed between said grid and said source of evaporation; and a power source means for establishing a predetermined electric potential relationship between said grid and said filament in which the potential of said grid is positive relative to the potential of said filament.

10. An apparatus for forming a thin film comprising:
a vacuum container to which an active gas, an inert gas or a mixture thereof is introduced;

a source of evaporation from which a substance is evaporated, disposed in said vacuum container;

a substrate holder disposed in said vacuum container for holding a substrate for forming a thin film thereon in such a manner as to be opposed to said source of evaporation and being electrically insulated from other elements;

a grid disposed between said source of evaporation and said substrate holder and having openings which allow said substance being evaporated to pass therethrough, wherein said grid has a flat surface or a curved surface and the area of said opening per unit area is varied in the plane of said grid;

a filament for thermionic emission disposed between said grid and said source of evaporation; and a power source means for establishing a predetermined electric potential relationship between said grid and said filament in which the potential of said grid is positive relative to the potential of said filament.

11. An apparatus for forming a thin film comprising:

a vacuum container to which an active gas, an inert gas or a mixture thereof is introduced;

a source of evaporation from which a substance is evaporated, disposed in said vacuum container;

a substrate holder disposed in said vacuum container for holding a substrate for forming a thin film thereon in such a manner as to be opposed to said source of evaporation and being electrically insulated from other elements, wherein said substrate holder is made of an electrically insulating material;

a grid disposed between said source of evaporation and said substrate holder and having openings which allow said substance being evaporated to pass therethrough, wherein said grid has a flat surface or a curved surface and the area of said opening per unit area is varied in the plane of said grid;

a filament for thermionic emission disposed between said grid and said source of evaporation; and a power source means for establishing a predetermined electric potential relationship between said grid and said filament in which the potential of said grid is positive relative to the potential of said filament.

12. An apparatus for forming a thin film comprising:

a vacuum container to which an active gas, an inert gas or a mixture thereof is introduced;

a source of evaporation from which a substance is evaporated, disposed in said vacuum container;

a substrate holder disposed in said vacuum container for holding a substrate for forming a thin film thereon in such a manner as to be opposed to said source of evaporation and being electrically insulated from other elements, wherein said substrate holder is made of an electrically conductive material;

a grid disposed between said source of evaporation and said substrate holder and having openings which allow said substance being evaporated to pass therethrough, wherein said grid has a flat surface or a curved surface and the area of said opening per unit area is varied in the plane of said grid;

a filament for thermionic emission disposed between said grid and said source of evaporation; and a power source means for establishing a predetermined electric potential relationship between said grid and said filament in which the potential of said grid is positive relative to the potential of said filament.

13. An apparatus for forming a thin film comprising:

a vacuum container to which an active gas, an inert gas or mixture thereof is introduced;

a source of evaporation from which a substance is evaporated and which also serves as a filament for thermionic emission, disposed in said vacuum container;

a counter electrode disposed in said vacuum container and holding a substrate for forming a thin film thereon in such a manner as to be opposed to said source of evaporation;

a grid disposed between said source of evaporation and said counter electrode and having openings which allow said substance being evaporated to pass therethrough, wherein said grid has a flat surface or a curved surface and the area of said opening per unit area is varied in the plane of said grid; and a power source means for establishing a predetermined electric potential relationship between said source of evaporation and said grid in which the potential of said grid is positive relative to the potential of said source of evaporation.

* * * * *